United States Patent
Soni

(10) Patent No.: US 11,902,057 B2
(45) Date of Patent: Feb. 13, 2024

(54) DECISION FEEDBACK EQUALIZATION TAPS AND RELATED APPARATUSES AND METHODS

(71) Applicant: Microchip Technology Incorporated, Chandler, AZ (US)

(72) Inventor: Ravish Soni, Madhya Pradesh (IN)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/456,242

(22) Filed: Nov. 23, 2021

(65) Prior Publication Data

US 2022/0166652 A1    May 26, 2022

Related U.S. Application Data

(60) Provisional application No. 63/198,958, filed on Nov. 25, 2020.

(51) Int. Cl.
| | |
|---|---|
| *H04L 25/03* | (2006.01) |
| *H03K 5/133* | (2014.01) |
| *H03K 17/687* | (2006.01) |

(52) U.S. Cl.
CPC ....... *H04L 25/03057* (2013.01); *H03K 5/133* (2013.01); *H03K 17/6871* (2013.01)

(58) Field of Classification Search
CPC ..... H04L 25/03057; H04L 2025/03445; H04L 25/03146; H03K 5/133; H03K 17/6871
See application file for complete search history.

(56) References Cited

U.S. PATENT DOCUMENTS

| | | | |
|---|---|---|---|
| 10,785,015 B1* | 9/2020 | Rada | ...................... H04L 7/0087 |
| 2017/0264467 A1* | 9/2017 | Neto | ................... H04L 25/0292 |
| 2017/0373889 A1 | 12/2017 | Sakai | |
| 2019/0222444 A1* | 7/2019 | Sreeramaneni | ... H04L 25/03343 |
| 2022/0302943 A1* | 9/2022 | Bandi | ............... H04L 25/03318 |

OTHER PUBLICATIONS

Ankur et al., "A 19-GB/s Serial Link Receiver With Both 4-Tap FFE and 5-Tap DFE Functions in 45-nm SOI CMOS", IEEE Journal of Solid-State Circuits, vol. 47, No. 12, (Dec. 2012) pp. 3220-3231.

(Continued)

*Primary Examiner* — Dac V Ha
(74) *Attorney, Agent, or Firm* — TraskBritt

(57) ABSTRACT

Decision feedback equalization (DFE) taps and related apparatuses and methods are disclosed. An apparatus includes a first electrically controllable switch, a second electrically controllable switch, and one or more delay elements. The first electrically controllable switch receives a history bit and selectively provides the history bit to gate terminals of first transistors of a DFE tap circuitry. The second electrically controllable switch receives a complementary history bit and selectively provides the complementary history bit to second gate terminals of second transistors of the DFE tap circuitry. The one or more delay elements provide one or more delayed data integration clock signals responsive to one or more data integration clock signals. A complementary delayed data integration clock signal controls switching of the first electrically controllable switch and the second electrically controllable switch.

8 Claims, 5 Drawing Sheets

(56) References Cited

OTHER PUBLICATIONS

International Search Report from International Application No. PCT/US2021/072568, dated May 25, 2022, 8 pages.
International Written Opinion from International Application No. PCT/US2021/072568, dated May 25, 2022, 24 pages.
Invitation to Pay Additional Fees from International Application No. PCT/US2021/072568, dated Apr. 4, 2022, 17 pages.
Seo et al., "Transactions Briefs—A 7.8-GB/s 2.9-pJ/b Single-Ended Receiver With 20-Tap DFE for Highly Reflective Channels", IEEE Transactions on Very Large Scale Integration (VLSI) Systems, vol. 28, No. 3, (Mar. 2020) pp. 818-822.

* cited by examiner

DECISION FEEDBACK EQUALIZATION TAPS AND RELATED APPARATUSES AND METHODS

CROSS-REFERENCE TO RELATED APPLICATION

This application claims the benefit under 35 U.S.C. § 119(e) of U.S. Provisional Patent Application No. 63/198,958, filed Nov. 25, 2020, and titled "ULTRA HIGH-SPEED TAP FOR DECISION FEEDBACK EQUALIZERS (DFE) WITH A CURRENT INTEGRATING SUMMER," the entire disclosure of which is hereby incorporated herein by reference.

TECHNICAL FIELD

This disclosure relates generally to decision feedback equalization (DFE) taps, and more specifically to reset, or equivalently semi-wake-up, states between active states of DFE taps.

BACKGROUND

For very high speed links the long reach channel applications have a very high loss at the Nyquist frequency, which causes severe inter-symbol interference (ISI) leading to eye closure. A receiver for such links relies on decision feedback equalization (DFE) to cancel this ISI and open the eye. A difficulty of DFE design, however, is the timing closure of taps with direct feedback, especially at relatively high data rates (e.g., 32 gigabits per second (GBPS)).

While the issue of the timing closure of a first tap may be dealt with by following a loop unrolled architecture, a loop unrolled architecture comes at the cost of additional area and power. Closing the timing for a second tap may also be challenging at relatively high data rates where the timing closure of the first tap is addressed using a loop unrolled architecture. Following the same approach for closing the timing for the second tap (e.g., loop unrolled architecture) as for the first tap may lead to further increase in hardware, power, and parasitic capacitance for a summer circuit. Accordingly, the second tap may be closed using direct feedback, thus encountering the timing difficulty indicated above.

In theory, a second post cursor bit for a quarter rate DFE architecture with a current integrating summer is available one unit interval (1 UI) before integration starts or 2 UI before the sampling instant, where 1 UI=31.25 picoseconds for 32 Gbps. In practice, because of the circuit delays, the second post cursor bit is available only after the data integration starts for the summer, which leaves a very small time window within which the tap has to function reliably and is thus very challenging. As a result, it may be desirable to use taps that operate at very high speeds for high data rate applications. Designing a high-speed TAP, however, is a challenge. At high data rates, taps may work in a small duration. If the taps are not fast enough, a history bit may need to arrive earlier in time, or arrive too late.

BRIEF DESCRIPTION OF THE DRAWINGS

While this disclosure concludes with claims particularly pointing out and distinctly claiming specific examples, various features and advantages of examples within the scope of this disclosure may be more readily ascertained from the following description when read in conjunction with the accompanying drawings, in which:

DETAILED DESCRIPTION

Figure 1:
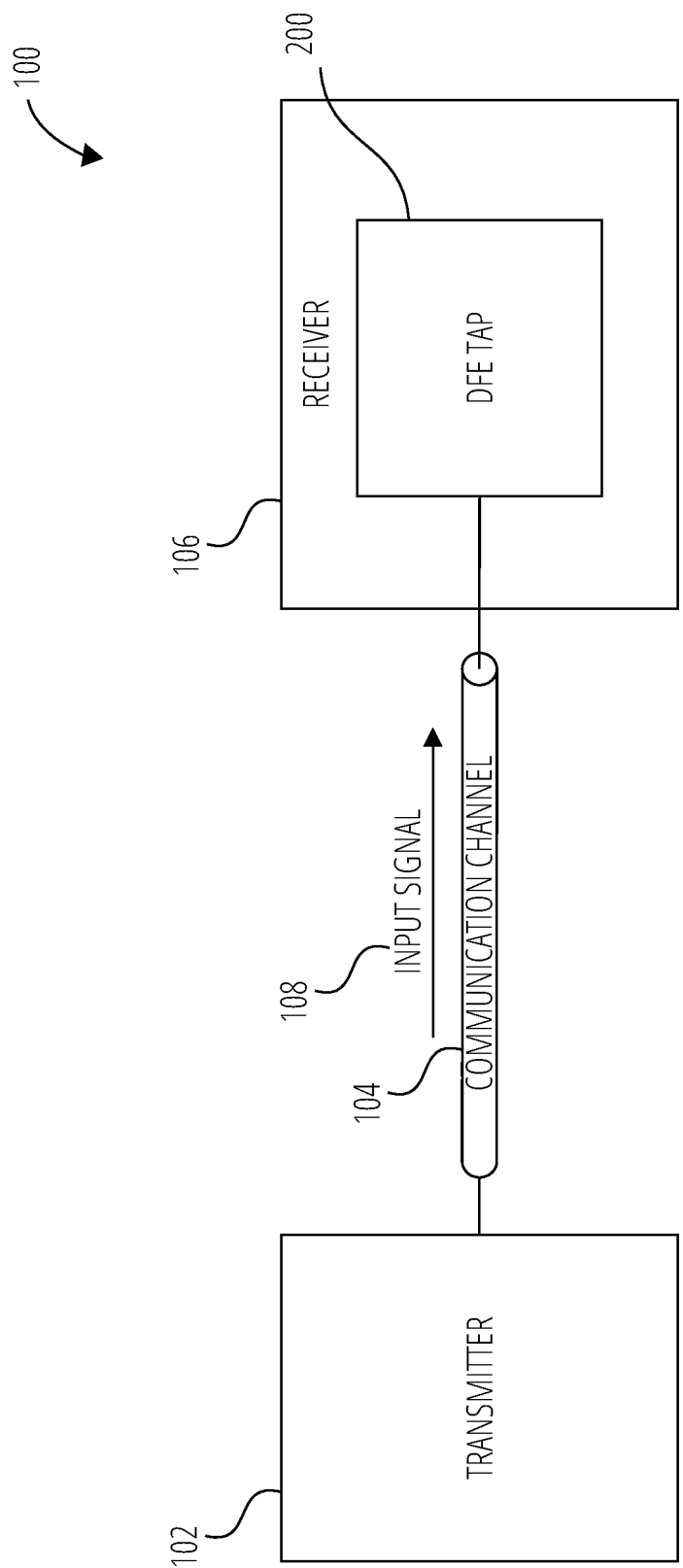
FIG. 1 is a block diagram of a communication system, according to some examples.

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Using DFE taps having two states depending on a polarity of an input history bit to the tap, either "0" or "1," may result in consuming timing margin and limiting speed. The consuming of timing margin and the limiting of speed may be related to strong steering of current to one side (e.g., either "0" or "1") depending on the input. Switching to the next state may involve the total current to be steered to the other side (e.g., the other of "0" or "1").

One example of a DFE tap that has two states depending on the polarity of the input history bit to the tap is a DFE tap with a loop unrolled first tap and other higher taps with direct feedback. A summer of a DFE with more than one tap with a loop unrolled first tap may receive a data input signal and feedbacks from a second tap and a third tap. The DFE tap with a loop unrolled first tap addresses timing closure of a critical DFE Tap (e.g., a tap with the most stringent time closure constraints such as the first tap followed by the second tap) for Peripheral Component Interconnect-Express (PCIE) 5.0 specification (sometimes referred to herein as PCIE Gen5). High data rate serializer/de-serializer (SERDES) designs with a long reach channel application have a very high loss at the Nyquist frequency and rely on DFE to equalize the channel loss. As indicated above, a difficult part in a DFE design is the timing closure of critical taps with direct feedback, especially at high data rates such as those of PCIE Gen5 (32 Gbps). While timing closure of the first tap is dealt with by following a loop unrolled architecture, it comes at the cost of additional area and power.

Dealing with the timing complexity of the second tap with direct feedback may be challenging at such high data rates. Using the same approach for the second tap in a loop unrolled architecture as for the first tap may result in a further increase in the hardware, the power and the parasitic capacitance for the summer. Disclosed herein is a high-speed tap that facilitates timing closure of the tap with stringent timing constraints, especially at such very high data rates.

As indicated above, another example of a DFE tap that has two states depending on the polarity of the input history bit to the tap is a quarter rate DFE. In practice, however, because of the circuit delays in a quarter rate DFE, the second post cursor bit only reaches the summer after the integration starts, leaving the available integration period for the tap ≤0.5 UI (unit intervals).

Disclosed herein is the use of a third state such as a "semi-wake-up state," or equivalently a "reset state," which puts the tap in a reset state or a semi-wake-up state until the arrival of a post cursor bit. The tap may therefore have three states: "0," "1," and "semi-wake-up" or "reset." When the tap makes a transition from "0" to "1," the tap may actually transition from "0" to "semi-wake-up" to "1." Likewise, when the tap makes a transition from "1" to "0," the tap may actually transition from "1" to "semi-wake-up" to "0." In the semi-wake-up state the history bit inputs to the tap may be gated and tap input terminals may be driven to a common mode voltage potential (VCM). Thus, half of the total current to be steered flows through both the paths of a pair of transistors and only half of the current is steered when a change of state occurs, which speeds up the tap operation.

Further speed-up may be possible when both the history bit inputs D, and the complement DB, to the tap can be reset (e.g., to a logic level low, or "0," without limitation) when the sampler is in a reset state. A reset state of the sampler is different from a reset, or semi-wake up, state of a DFE tap. Driving both history bit inputs D, and the complement DB, to the same logic level during a sampler reset state reduces the effective coupling capacitance between these signals by 50% as only one signal makes a transition. Since the history bit D and its complement DB are not passed through a latch (they are passed through a buffer), both of these signals will be of the same polarity as long as the sampler is in the sampler reset state. When the sampler is in an active state the sampler provides complementary differential history bits D and the complement DB. As a result, in a transition from a sampler reset state to a sampler active state only one of the history bits D and its complement dB changes state.

The modifications to the tap architecture, for example the addition of a "semi-wake-up state," speed up the tap operation. This makes it possible to close the timing for the tap and provide equalization within durations less than, or equal to, 0.5 UI of integration time.

The integration period of the summer is 1 UI. Because of delays of the sampler, an SR latch, speculative multiplexer, and the interconnect, however, a total delay period of time TDEL introduced by the SR latch, the speculative multiplexer, and the interconnect may be greater than or equal to 1.5 UI. The total delay period of time TDEL is an amount of time that a history bit D and its complement DB go through for the 2nd tap before they reach the second DFE tap. Ideally TDEL should be less than or equal to 1 UI for the second tap. If TDEL=1 UI, the history bit D and its complement DB coming to the second tap arrive just in time and the integration duration for the second tap will be the same as for the input data. As a result, the second history bit should reach the second tap just when the data integration of the summer starts.

In practice, however, TDEL is greater than or equal to 1.5 UI and the available integration period is less than or equal to 0.5 UI. Accordingly, the history bit to the second DFE tap arrives later than needed (after the data integration starts). Various examples disclosed herein delay the integration of the second DFE tap until the arrival of this history bit. Delaying the integration of the second DFE tap may be accomplished by putting the DFE tap in a reset, or semi-wake-up, state where the DFE tap gives no equalization but is also not in an OFF state. The duration from the start of the data integration to the actual arrival of the tap history bit is when the DFE tap is put into a state called a "semi-wake-up state" or a "reset state" in the modified tap architecture. In the semi-wake-up state the D/DB history bit inputs to the tap are gated and are driven instead to a common mode voltage potential, or near the common mode voltage potential (e.g., 0.55*VDD). The data integration clock is delayed using clock buffers to align with the arrival of the tap history bit and this delayed clock signal is used to gate the inputs going to the transistors of the differential pairs in the DFE tap. The DFE tap is set to the semi-wake-up state until the arrival of the post cursor bit. This avoids integrating the previous history bit, which would lead to an incorrect equalization.

During the semi-wake-up state, as both the inputs of the differential pair are driven to a same value, which is VCM (e.g., VCM=VSS+0.55*(VDD−VSS), without limitation), both the arms of the differential pair carry half of the total current to be steered and only half of the current needs to be steered when a change of state occurs, which increases the speed of the tap.

A further increase in the speed may be possible by resetting both the inputs D/DB coming to the tap along with the summer and the sampler. The sampler output may be passed through a buffer that drives the inputs to the tap. Thus, the tap inputs may be reset when the sampler is in a reset state, and only one signal makes a transition, reducing the effective coupling capacitance by 50% and increasing speed.

FIG. 1 is a block diagram of a communication system 100, according to some examples. The communication system 100 includes a transmitter 102, a receiver 106, and a communication channel 104 electrically connecting the transmitter 102 to the receiver 106. In some examples the receiver 106 is a peripheral communication interface express (PCIe) receiver. The receiver 106 receives, via the communication channel 104, an input signal 108 from the transmitter 102. The receiver 106 includes a DFE tap 200 with a semi-wake-up, or reset, state.

Figure 2:
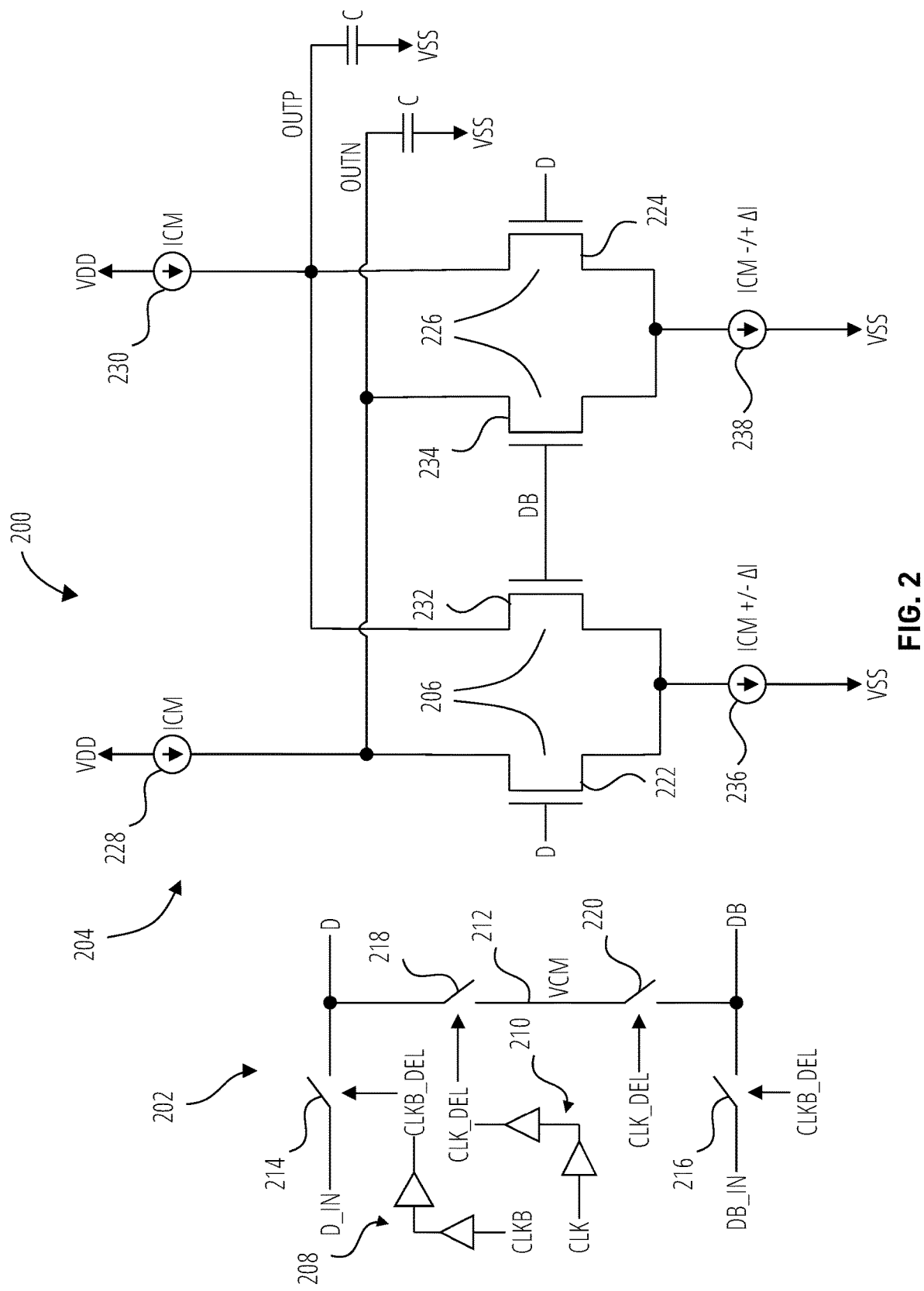
FIG. 2 is a circuit schematic illustration of a DFE tap of a receiver of FIG. 1, according to some examples.

FIG. 2 is a circuit schematic illustration of the DFE tap 200 of the receiver 106 of FIG. 1, according to some examples. The DFE tap 200 includes gating circuitry 202 and DFE tap circuitry 204. Input terminals of the DFE tap circuitry 204 are gated by the gating circuitry 202 using data integration clock signals CLK, and its complement CLKB (see FIG. 3 for a signal timing diagram 300 of some of the signals of FIG. 2) and driven to a common mode voltage potential VCM during a semi-wake-up or reset state of the DFE tap 200.

The gating circuitry 202 includes a first electrically controllable switch 214 to receive a history bit D_IN and selectively provide the history bit D_IN as delayed history bit D to gate terminals of first transistors (e.g., first transistors 222, 224) of the DFE tap circuitry 204. The gating circuitry 202 also includes a second electrically controllable switch 216 to receive a complementary history bit DB_IN and selectively provide the complementary history bit as delayed complementary history bit DB to gate terminals of second transistors (e.g., second transistors 232, 234) of the DFE tap circuitry 204. The gating circuitry 202 includes one or more delay elements (e.g., one or more first delay elements 208 and one or more second delay elements 210) to provide one or more delayed data integration clock signals (e.g., CLK_DEL, CLKB_DEL) responsive to one or more data integration clock signals (e.g., CLK, CLKB). A complementary delayed data integration clock signal CLKB_DEL of the one or more delayed data integration clock signals controls switching of the first electrically controllable switch 214 and the second electrically controllable switch 216.

The one or more delay elements include one or more first delay elements 208 to provide a delayed data integration clock signal CLK_DEL responsive to a data integration clock signal CLK. The one or more delay elements also include one or more second delay elements 210 to provide the complementary delayed data integration clock signal CLKB_DEL responsive to a complementary data integration clock signal CLKB. In some examples the one or more first delay elements 208 and the one or more second delay elements 210 may include strings of logic gates to delay the one or more data integration clock signals CLK, CLKB (e.g., strings of inverters, strings of complementary metal-oxide-semiconductor (CMOS) buffers; the triangles shown in FIG. 2 for the one or more first delay elements 208 and the one or more second delay elements 210 may be logic gates or buffers).

The data integration clock signal CLK and the complementary data integration clock signal CLKB may be complementary to each other. In other words, where the data integration clock signal CLK is at a logic level high voltage potential, the complementary data integration clock signal CLKB will be at a logic level low voltage potential, and where the data integration clock signal CLK is at a logic level low voltage potential, the complementary data integration clock signal CLKB will be at a logic level high voltage potential. The data integration clock signals CLK, CLKB are delayed by the one or more first delay elements 208 and the one or more second delay elements 210, respectively, to provide delayed data integration clock signals CLK_DEL, CLKB_DEL, which align with the arrival of history bits D_IN, DB_IN.

The gating circuitry 202 includes a common mode voltage potential node 212, a third electrically controllable switch 218, and a fourth electrically controllable switch 220. The third electrically controllable switch 218 is electrically connected from the common mode voltage potential node 212 to the gate terminals of the first transistors 222, 224. The fourth electrically controllable switch 220 is electrically connected from the common mode voltage potential node 212 to the gate terminals of the second transistors 232, 234. The delayed data integration clock signal CLK_DEL controls switching of the third electrically controllable switch 218 and the fourth electrically controllable switch 220. Accordingly, the gating circuitry 202 delivers a common mode voltage potential VCM to the gate terminals, which triggers the semi-wake-up or reset state, i.e., when third and fourth electrically controllable switches 218, 220 are closed responsive to delayed data integration clock signal CLK_DEL.

The delayed data integration clock signal CLK_DEL may thus control switching of the third electrically controllable switch 218 and the fourth electrically controllable switch 220 to electrically connect the common mode voltage potential node 212 to the gate terminals of the first transistors 222, 224 and the gate terminals of the second transistors 232, 234 to enable the semi-wake-up state, or equivalently the reset state. Accordingly, the gating circuitry 202 enables addition of the semi-wake-up state, or equivalently the reset state. The gating circuitry 202 holds the DFE tap circuitry 204 in the semi-wake-up or reset state until after arrival of the history bits D_IN, DB_IN to avoid integrating a previous history bit. Holding the DFE tap 200 in the semi-wake-up state until the arrival of the history bits D_IN, DB_IN, which as indicated above are aligned with the delayed data integration clock signals CLK_DEL, CLKB_DEL, speeds up the DFE tap 200 and avoids integrating the previous history bit, which may lead to equalization in the wrong direction. As a result, it may be possible to close the tap with direct feedback. Direct feedback means that the history bits go to the DFE taps associated with the summer. The summer and the DFE taps perform integration of the input data and the input history bits, respectively, and the output of the summer is then sampled by the sampler. This sampled bit may be the history bit with appropriate delays. There is a limited time within which these history bits should settle in this feedback system.

The DFE tap circuitry 204 includes a first common mode current source 228, a second common mode current source 230, a first pull-down current source 236, a second pull-down current source 238, a first pair of transistors 206, and a second pair of transistors 226. Each of the first common mode current source 228 and the second common mode current source 230 may provide a common mode current ICM. The first pull-down current source 236 and the second pull-down current source 238 may each source the common mode current ICM plus or minus a change in current ΔI, wherein the change in current ΔI may vary from +ICM to −ICM. The current of the first pull-down current source 236 and the second pull-down current source 238 may be programmable through a control code and based on the control code may be varied from ICM−ΔI to ICM+ΔI. Accordingly, ΔI may be the signal current. By varying the current of the first pull-down current source 236 and the second pull-down current source 238, the tap weight or equalization provided by the tap may be varied. The first common mode current source 228 and the second common mode current source 230 may carry a fixed current, each equal to ICM.

The first pair of transistors 206 includes the first transistor 222, which is electrically connected from the first common mode current source 228 to the first pull-down current source 236. The first pair of transistors 206 also includes the second transistor 232, which is electrically connected from the second common mode current source 230 to the first pull-down current source 236. The second pair of transistors 226 includes the first transistor 224, which is electrically connected from the second common mode current source 230 to the second pull-down current source 238. The second pair of transistors 226 also includes the second transistor 234, which is electrically connected from the first common mode current source 228 to the second pull-down current source 238.

The DFE tap circuitry 204 also includes a first output node OUTN and a second output node OUTP. The first output node OUTN is electrically connected between the first common mode current source and the first transistor 222 of the first transistor pair 206. The second output node OUTP is electrically connected between the second common mode current source 230 and the first transistor 224 of the second transistor pair 226. Stated another way, the DFE tap circuitry 204 includes pairs of transistors 206, 226, each of which includes drain terminals electrically connected to respective output nodes OUTN, OUTP of the DFE tap circuitry 204. Each of the pairs of transistors 206, 226 includes gate terminals to receive delayed complementary history bits D, DB.

Complementary history bits D_IN and DB_IN are gated by the gating circuitry 202 using the complementary delayed data integration clock signal CLKB_DEL and the gate terminals of the pairs of transistors 206, 226 are driven to the common mode voltage potential VCM during the semi-wake-up or reset state. Delayed complementary history bits D and DB switch from 0 to VCM to 1, or from 1 to VCM to 0 when a change of state occurs.

First transistor 222 of the first transistor pair 206, second transistor 232 of the first transistor pair 206, first transistor 224 of the second transistor pair 226, and second transistor 234 of the second transistor pair 226, may each carry ICM/2 during the semi-wake-up or reset state. During a transition from the reset state to an active state (e.g., a tap integration state) first transistor 222 of the first transistor pair 206 and first transistor 224 of the first transistor pair 206 may transition from carrying a current ICM/2 to ICM, or from ICM/2 to zero. Also, during a transition from the reset state to an active state, second transistor 232 of the first transistor pair 206 and second transistor 234 of the second transistor pair 226 may transition from carrying a current ICM/2 to zero, or from ICM/2 to ICM. This speeds up the signal swing at the output nodes OUTN, OUTP since the maximum transition in current carried by the transistors 222, 224, 232, and 234 is only half of the common mode current ICM.

Figure 3:
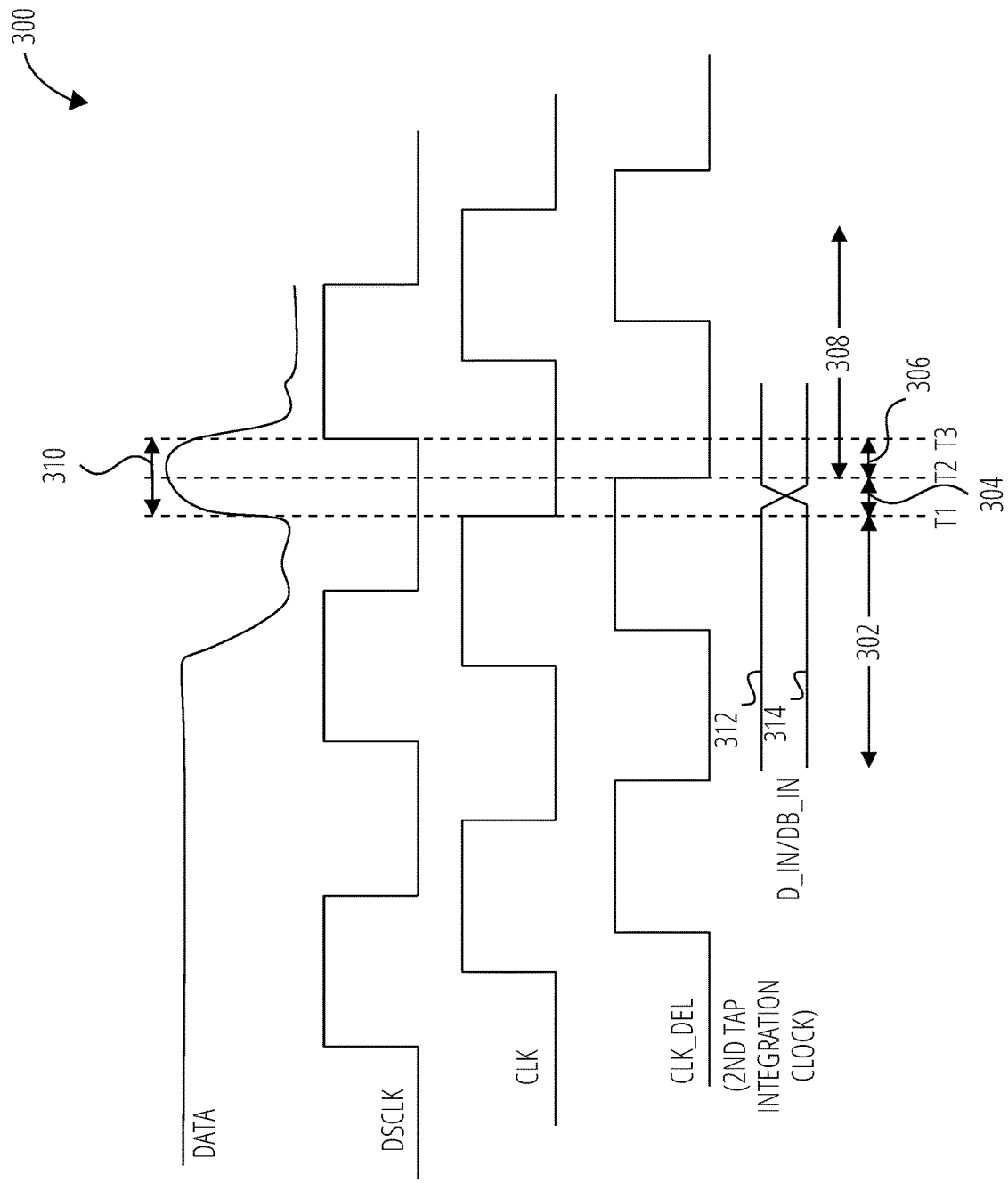
FIG. 3 is a signal timing diagram illustrating signals of the tap of FIG. 2.

FIG. 3 is a signal timing diagram 300 illustrating signals of the DFE tap 200 of FIG. 2. The signal timing diagram 300 illustrates a data signal DATA (e.g., the input signal 108 of FIG. 1 on which the equalization is to be performed), a data sampling clock signal DSCLK, a data integration clock signal CLK, and a delayed data integration clock signal CLK_DEL. The data integration clock signal CLK may be substantially ninety degrees out of phase with the data sampling clock signal DSCLK. Although not shown, the complementary data integration clock signal CLKB and the delayed complementary data integration clock signal CLKB_DEL would be complementary to the data integration clock CLK and the delayed data integration clock CLK_DEL, respectively, illustrated in FIG. 3.

Referring to FIG. 2 and FIG. 3 together, as previously discussed, the DFE tap 200 operates in three different states (a first logic state 302, a reset, or semi-wake-up, state 304, and a second logic state 308) The first logic state 302 opposes the second logic state 308. For example, as shown in FIG. 3 a previous history bit 312 (D_IN) is at a logic level high and a previous complementary history bit 314 (DB_IN) is at a logic level low.

A state change may occur only when one of the history complementary history bits D_IN, DB_IN makes a transition. When the DFE tap 200 makes a transition from the first logic state 302 to the second logic state 308, the DFE tap 200 transitions from the first logic state 302 to the reset state 304 at time T1 (responsive to the delayed integration clock signal CLK_DEL transitioning to a logic level high voltage potential, which closes the third electrically controllable switch 218 and the fourth electrically controllable switch 220, electrically connecting the gate terminals of transistors 222, 224, 232, and 234 to the common mode voltage potential node 212), then from the reset state 304 to the second logic state 308 at time T2. Likewise, when the DFE tap 200 transitions from the second logic state 308 back to a subsequent first logic state similar to the first logic state 302, the DFE tap 200 transitions from the second logic state 308 to a subsequent reset state similar to the reset state 304, then from the subsequent reset state to the subsequent first logic state. The history bit D_IN and the complementary history bit DB_IN may switch logic states during the reset state 304 of the DFE tap circuitry 204, which as indicated above is during the period that first and second electrically controllable switches 214, 216 are open and third and fourth electrically controllable switches 218, 220 are closed. After the history bit D_IN and the complementary history bit DB_IN have switched.

A data integration state 310 may begin at time T1, aligning with a falling edge of the data integration clock signal CLK. In the data integration state 310 the summer may integrate the data signal DATA. The data integration state 310 may extend until time T3, aligning with a rising edge of the data sampling clock signal DSCLK. A data signal at the output nodes OUTN, OUTP may be sampled at time T3, which is the end of the data integration state 310, responsive to the data sampling signal DSCLK (e.g., responsive to the rising edge of the data sampling signal DSCLK). A tap active state 306 may begin at time T2, aligning with a falling edge of the delayed data integration clock signal CLK_DEL. Accordingly, the delay introduced by the one or more first delay elements 208 and the one or more second delay elements 210 should be less than ninety degrees to prevent the falling edge of the delayed integration clock signal CLK_DEL from occurring after time T3, which time T3 aligns with the rising edge of the data sampling clock signal DSCLK. Both the data integration state 310 and the tap active state 306 may end at time T3 responsive to the rising edge of the data sampling clock signal DSCLK. Although the DFE tap circuitry 204 (FIG. 2) does not receive the data sampling clock signal DSCLK, the data sampling clock DSCLK may trigger the sampler to take a sample of the summer output. Once the sampler slices the data output of the summer, the tap active state 306 may be considered to end even though integration may continue for 1 UL.

As previously discussed, gating circuitry 202 may transition the DFE tap circuitry 204 from the first logic state 302 to the reset state 304, then from the reset state 304 to the second logic state 308, the second logic state 308 opposing the first logic state 302. The gating circuitry 202 gates responsive to data integration clock signals CLK, CLKB. The gating circuitry 202 delays the data integration clock signals to provide delayed data integration clock signals CLK_DEL, CLKB_DEL aligned with arrival of the history bit D_IN, DB_IN.

During the reset state 304 a first non-zero portion of the common mode current ICM flows through a first transistor (e.g., one of the first transistors 222, 224) of each pair of transistors 206, 226, and a second non-zero portion of the common mode current ICM flows through a second transistor (e.g., one of the second transistors 232, 234) of each pair of transistors 206, 226. The first non-zero portion of the common mode current and the second non-zero portion of the common mode current are each substantially equal to half the common mode current (ICM/2). In other words, in the reset state 304 half of the total current to be steered flows through both the paths of each pair of transistors 206, 226 of the DFE tap circuitry 204 (FIG. 2) and only half of the current (ICM/2) needs to be steered when a change of state occurs, speeding up the DFE tap 200. The DFE tap circuitry 204 may not provide equalization during the reset state 304.

Without the gating circuitry 202, as the second tap is active at the same time as data is integrated by the summer, delay in the arrival of the history bit will lead to equalization based on the previous history bit until the current history bit arrives. For example, the data integration clock CLK may go low before the complementary history bits D_IN and DB_IN have settled to their new values, and the second tap may be driven by pre-settled values for the complementary history bits D_IN and DB_IN. This may lead to equalization in the wrong direction. As a result, integration/equalization of the tap needs to be delayed (or no equalization performed) until the arrival of the history bit. Accordingly, as discussed above, the gating circuitry 202 holds the DFE tap circuitry 204 in the semi-wake-up or reset state 304 until after arrival of the history bits D_IN, DB_IN to avoid integrating the previous history bit 312 and the previous complementary history bit 314. Inclusion of the gating circuitry 202 prevents this integration of the previous history bit 312 and the previous complementary history bit 314 from happening.

Figure 4:
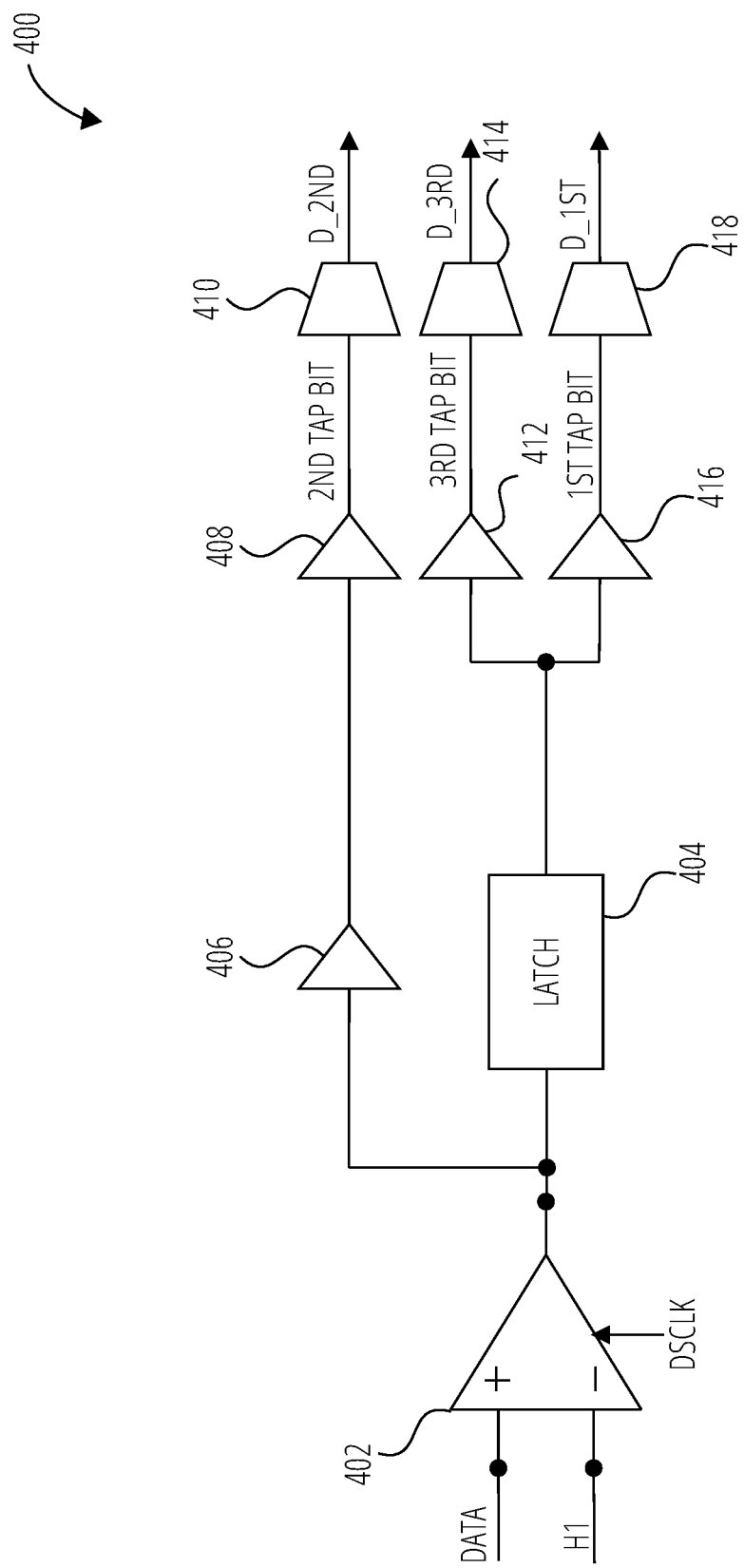
FIG. 4 is a circuit schematic illustration of a resetting post sampler path 400, according to some examples.

FIG. 4 is a circuit schematic illustration of a resetting post sampler path 400, according to some examples. As previously discussed, adding a semi-wake-up or reset state speeds up the tap operation. Further increase in the speed may be achieved if both the inputs to the tap (D & DB) are reset to a logic level low (e.g., a "0") or to a logic level high (e.g., a "1") voltage potential when the sampler and summer are in a reset state. A reset state of the sampler is sometimes referred to herein as a "sampler reset state." Accordingly, gate terminals of the pairs of transistors 206, 226 are both reset to a logic level zero or a logic level one responsive to a sampler reset state.

The resetting post sampler path 400 includes a sampler 402 to sample the output of the summer, which sampler 402 may be clocked by the data sampling clock signal DSCLK (FIG. 3). A tap signal H1 may be provided to the sampler 402 and represents a first tap value. The resetting post sampler path 400 also includes a buffer 406 and a latch 404 electrically connected to an output terminal of the sampler 402. The resetting post sampler path 400 includes a buffer 408 electrically connected to the output of the buffer 406, and a speculative multiplexer 410 electrically connected to the output of buffer 408. The buffer 408 provides a second tap bit 2ND TAP BIT to the speculative multiplexer 410. The resetting post sampler path 400 also includes buffers 412, buffer 416 electrically connected to the output of latch 404, and speculative multiplexers 414, 418 electrically connected to the outputs of buffers 412, 416, respectively. The buffers 412, 416 provide a third tap bit 3RD TAP BIT and a first tap bit 1ST TAP BIT, respectively, to the speculative multiplexers 414, 418, respectively. The speculative multiplexers 410, 414, and 418 provide history bits D_2ND, D_3RD, and D_1ST, respectively, which may be provided to input terminals (e.g., transistor gate terminals) of a DFE tap circuitry (e.g., the DFE tap circuitry 204 of FIG. 2).

When the sampler 402 is in a reset state (when DSCLK is low), the outputs of the sampler 402 are pulled up to a logic level high voltage potential (e.g., VDD). For the second tap path, the logic level high voltage potential is passed through a buffer 406 and not the latch 404. The latch 404 may hold its previous output when it is in an OFF state. The latch 404 is in an OFF state when the sampler 402 is in sampler reset. The differential output of the latch 404 will always be complementary. For the second tap path, the output of the sampler 402 goes through a buffer 406 and then through the speculative multiplexer 410. When the sampler 402 is in the sampler reset state, both the outputs of the sampler 402 are at a logic level high or "1" and they are passed through a buffer 406 and then the speculative mux, after which they become a logic level low voltage potential or "0." Thus, whenever the sampler 402 is in an active state and resolves the input analog signal DATA to a full rail digital signal, only one of the signals at the sampler output will make a transition from 1 to 0 and therefore only one of the complementary history bit signals D_IN/DB_IN will make a transition.

In tap architectures without the semi-wake-up state and sampler reset state the history bits input to the tap may be driven by a latch that holds the previous value when the sampler is in a reset state. In contrast, in tap architectures disclosed herein, which include the semi-wake-up state and a sampler reset state, only one signal toggles when a change of state occurs, reducing the effective coupling capacitance between input lines D and DB by 50%, improving the speed.

Figure 5:
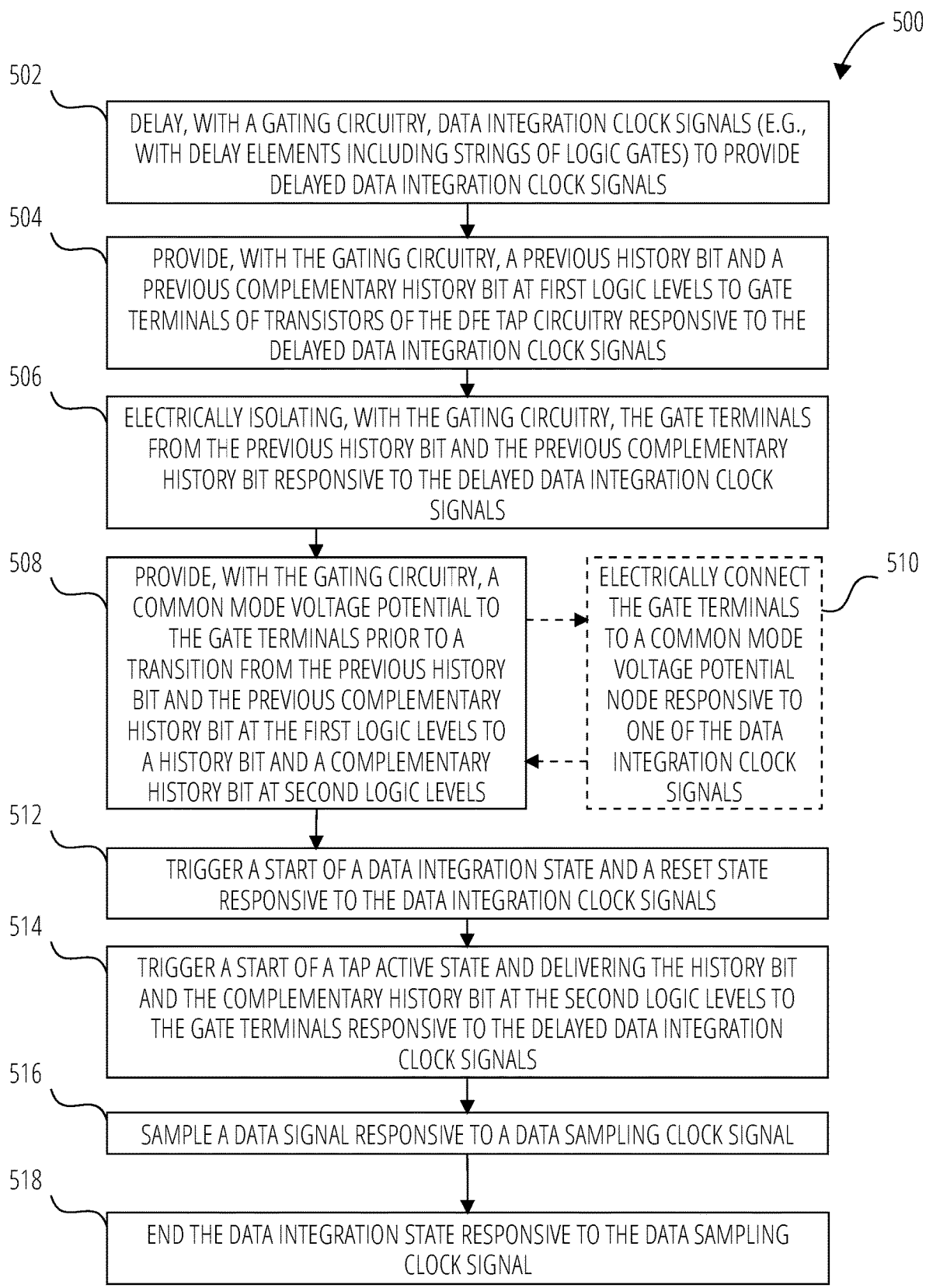
FIG. 5 is a flowchart illustrating a method of controlling a DFE tap circuitry, according to some examples.

FIG. 5 is a flowchart illustrating a method 500 of controlling a DFE tap circuitry (e.g., the DFE tap circuitry 204 of FIG. 2), according to some examples. At operation 502 the method 500 includes delaying, with a gating circuitry (e.g., the gating circuitry 202 of FIG. 2), data integration clock signals (e.g., the data integration clock signal CLK and the complementary data integration clock signal CLKB of FIG. 2) to provide delayed data integration clock signals (e.g., the delayed data integration clock signal CLK_DEL and the delayed complementary data integration clock signal CLKB_DEL of FIG. 2). In some examples, delaying the data integration clock signals includes delaying the data integration clock signals with delay elements of the gating circuitry, the delay elements including strings of logic gates or buffers.

At operation 504 the method 500 includes providing, with the gating circuitry, a previous history bit (e.g., the previous history bit 312 of FIG. 3) and a previous complementary history bit (e.g., the previous complementary history bit 314 of FIG. 3) at first logic levels to gate terminals of transistors (e.g., the transistors 222, 224, 232, and 234 of FIG. 2) of the DFE tap circuitry responsive to the delayed data integration clock signals.

At operation 506 the method 500 includes electrically isolating, with the gating circuitry, the gate terminals (e.g., of the transistors 222, 224, 232, and 234 of FIG. 2) of the DFE tap circuitry from the previous history bit and the previous complementary history bit responsive to the delayed data integration clock signals.

At operation 508 the method 500 includes providing, with the gating circuitry, a common mode voltage potential (e.g., the common mode voltage potential VCM of FIG. 2) to the gate terminals (e.g., the transistors 222, 224, 232, and 234 of FIG. 2) of the DFE tap circuitry prior to a transition from the previous history bit and the previous complementary history bit at the first logic levels to a history bit and a complementary history bit at second logic levels. In some examples providing the common mode voltage potential to the gate terminals includes electrically connecting the gate terminals (e.g., of the transistors 222, 224, 232, and 234 of FIG. 2) of the DFE tap circuitry to a common mode voltage potential node (e.g., the common mode voltage potential node 212 of FIG. 2) responsive to one of the data integration clock signals at operation 510.

At operation 512 the method 500 triggers a start of a data integration state (e.g., the data integration state 310 of FIG. 3) and a reset state (e.g., the reset state 304 of FIG. 3) of the DFE tap circuitry responsive to the data integration clock signals. At operation 514 the method 500 includes triggering a start of a tap active state and delivering the history bit and the complementary history bit at the second logic levels to the gate terminals responsive to the delayed data integration clock signals.

At operation 516 the method 500 includes sampling a data signal responsive to a data sampling clock signal (e.g., the data sampling clock signal DSCLK of FIG. 3). At operation 518 the method 500 includes ending the data integration state responsive to the data sampling clock signal.

EXAMPLES

A non-exhaustive, non-limiting list of examples follows. Not each of the examples listed below is explicitly and individually indicated as being combinable with all others of the examples listed below and examples discussed above. It is intended, however, that these examples are combinable with all other examples unless it would be apparent to one of ordinary skill in the art that the examples are not combinable.

Example 1: An apparatus, comprising: a first electrically controllable switch to receive a history bit and selectively provide the history bit as a delayed history bit to gate terminals of first transistors of a decision feedback equalization (DFE) tap circuitry; a second electrically controllable switch to receive a complementary history bit and selectively provide the complementary history bit as a delayed complementary history bit to gate terminals of second transistors of the DFE tap circuitry; and one or more delay elements to provide one or more delayed data integration clock signals responsive to one or more data integration clock signals, a complementary delayed data integration clock signal of the one or more delayed data integration clock signals to control switching of the first electrically controllable switch and the second electrically controllable switch.

Example 2: The apparatus of Example 1, wherein the one or more delay elements include: one or more first delay elements to provide a delayed data integration clock signal of the one or more delayed data integration clock signals responsive to a data integration clock signal of the one or more data integration clock signals; and one or more second delay elements to provide the complementary delayed data integration clock signal responsive to a complementary data integration clock signal.

Example 3: The apparatus of Example 2, comprising: a common mode voltage potential node; a third electrically controllable switch electrically connected from the common mode voltage potential node to the gate terminals of the first transistors; and a fourth electrically controllable switch electrically connected from the common mode voltage potential node to the gate terminals of the one or more second transistor, the delayed data integration clock signal to control switching of the third electrically controllable switch and the fourth electrically controllable switch.

Example 4: The apparatus of Example 3, the delayed data integration clock signal to control switching of the third electrically controllable switch and the fourth electrically controllable switch to electrically connect the common mode voltage potential node to the gate terminals of the first transistors and the gate terminals of the second transistors during a reset state of the DFE tap circuitry.

Example 5: The apparatus of Example 4, wherein the history bit and the complementary history bit switch logic states during the reset state of the DFE tap circuitry.

Example 6: The apparatus according to any one of Examples 2-5, wherein the data integration clock signal is substantially ninety degrees out of phase with a data sampling clock signal.

Example 7: The apparatus according to any one of Examples 1-6, wherein the one or more delay elements include strings of logic gates to delay the one or more data integration clock signals.

Example 8: The apparatus according to any one of Examples 1-7, comprising the DFE tap circuitry, the DFE tap circuitry including: a first common mode current source; a second common mode current source; a first pull-down current source; a second pull-down current source; a first pair of transistors including one of the first transistors electrically connected from the first common mode current source to the first pull-down current source and one of the second transistors electrically connected from the second common mode current source to the first pull-down current source; and a second pair of transistors including another one of the first transistors electrically connected from the second common mode current source to the second pull-down current source and another one of the second transistors electrically connected from the first common mode current source to the second pull-down current source.

Example 9: The apparatus of Example 8, comprising: a first output node electrically connected between the first common mode current source and the one of the first transistors; and a second output node electrically connected between the second common mode current source and the other one of the first transistors.

Example 10: An apparatus, comprising: a decision feedback equalization (DFE) tap circuitry including a pair of transistors, the pair of transistors including drain terminals electrically connected to output nodes of the DFE tap circuitry, the pair of transistors including gate terminals to receive delayed complementary history bits; and a gating circuitry electrically connected to the gate terminals of the pair of transistors, the gating circuitry to transition the DFE tap circuitry from a first logic state to a reset state, then from the reset state to a second logic state, the second logic state opposing the first logic state, wherein during the reset state a first non-zero portion of a common mode current flows through a first transistor of the pair of transistors and a second non-zero portion of the common mode current flows through a second transistor of the pair of transistors.

Example 11: The apparatus of Example 10, wherein the first non-zero portion of the common mode current and the second non-zero portion of the common mode current are each substantially equal to half the common mode current.

Example 12: The apparatus according to any one of Examples 10 and 11, wherein the gating circuitry to deliver a common mode voltage potential to the gate terminals during the reset state.

Example 13: The apparatus according to any one of Examples 10-12, wherein the gate terminals of the pair of transistors are both reset to a logic level zero or a logic level one responsive to a sampler reset state.

Example 14: The apparatus according to any one of Examples 10-13, wherein the gating circuitry holds the tap circuitry in the reset state until after arrival of a history bit to avoid integrating a previous history bit.

Example 15: The apparatus according to any one of Examples 10-14, wherein: the gating circuitry delays data integration clock signals to align with arrival of a history bit, and gates responsive to the delayed data integration clock signals.

Example 16: A method of controlling a decision feedback equalization (DFE) tap circuitry, the method comprising: delaying, with a gating circuitry, data integration clock signals to provide delayed data integration clock signals; providing, with the gating circuitry, a previous history bit and a previous complementary history bit at first logic levels to gate terminals of transistors of the DFE tap circuitry responsive to the delayed data integration clock signals; electrically isolating, with the gating circuitry, the gate terminals from the previous history bit and the previous complementary history bit responsive to the delayed data integration clock signals; providing, with the gating circuitry, a common mode voltage potential to the gate terminals prior to a transition from the previous history bit and the previous complementary history bit at the first logic levels to a history bit and a complementary history bit at second logic levels; triggering a start of a reset state responsive to the data integration clock signals; triggering a start of a tap integration state and delivering the history bit and the complementary history bit at the second logic levels to the gate terminals responsive to the delayed data integration clock signals.

Example 17: The method of Example 16, comprising sampling a data signal responsive to a data sampling clock signal.

Example 18: The method of Example 17, comprising ending the tap integration and the data integration responsive to the data sampling clock signal.

Example 19: The method according to any one of Examples 17 and 18, wherein one of the data integration clock signals is substantially ninety degrees out of phase with the data sampling clock.

Example 20: The method according to any one of Examples 16-19, wherein delaying the data integration clock signals comprises delaying the data integration clocks signals with delay elements of the gating circuitry, the delay elements including strings of logic gates.

Example 21: The method according to any one of Examples 16-20, wherein providing the common mode voltage potential to the gate terminals comprises electrically connecting the gate terminals to a common mode voltage potential node responsive to one of the delayed data integration clock signals.

Example 22: A tap, comprising: tap circuitry including a differential pair of transistors, the differential pair of transistors including gate terminals configured to receive complementary input signals; and gating circuitry electrically connected to the gate terminals of the differential pair, the gating circuitry configured to implement a semi-wake-up state between a zero state and a one state of the tap circuitry, wherein during the semi-wake-up state a first non-zero portion of a common mode current flows through a first transistor of the differential pair and a second non-zero portion of the common mode current flows through a second transistor of the differential pair.

Example 23: The tap of Example 22, wherein the first non-zero portion of the common mode current and the second non-zero portion of the common mode current are substantially equal to half the common mode current.

Example 24: The tap according to any one of Examples 22 and 23, wherein the gating circuitry is configured to deliver a common mode voltage potential to the gate terminals during the semi-wake-up state.

Example 25: The tap according to any one of Examples 22-24, wherein the gate terminals of the differential pair of transistors are both reset to a zero or a one when a sampler is in a reset state.

Example 26: The tap according to any one of Examples 22-25, wherein the gating circuitry is configured to hold the tap circuitry in the semi-wake-up state until arrival of a history bit to avoid integrating a previous history bit.

Example 27: The tap according to any one of Examples 22-26, wherein the gating circuitry is configured to gate responsive to data integration clocks and wherein the gating circuitry is configured to delay the data integration clocks to align with arrival of a tap bit.

CONCLUSION

As used in the present disclosure, the terms "module" or "component" may refer to specific hardware implementations to perform the actions of the module or component and/or software objects or software routines that may be stored on and/or executed by general purpose hardware (e.g., computer-readable media, processing devices, etc.) of the computing system. In some examples, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:
a first electrically controllable switch to receive a history bit and selectively provide the history bit as a delayed history bit to gate terminals of first transistors of a decision feedback equalization (DFE) tap circuitry;
a second electrically controllable switch to receive a complementary history bit and selectively provide the complementary history bit as a delayed complementary history bit to gate terminals of second transistors of the DFE tap circuitry;

one or more delay elements to provide one or more delayed data integration clock signals responsive to one or more data integration clock signals that indicate a start of a data integration state, a complementary delayed data integration clock signal of the one or more delayed data integration clock signals to control switching of the first electrically controllable switch and the second electrically controllable switch a delay period of time after the one or more data integration clock signals indicate the start of the data integration state, to thereby delay the start of data integration of the DFE tap circuitry;

a third electrically controllable switch electrically connected from a common mode voltage potential node to the gate terminals of the first transistors of the DFE tap circuitry; and a fourth electrically controllable switch electrically connected from the common mode voltage potential node to the gate terminals of the second transistors of the DFE tap circuitry, the one or more delayed data integration clock signals to control switching of the third electrically controllable switch and the fourth electrically controllable switch to electrically connect the common mode voltage potential node to the gate terminals of the first transistors and the gate terminals of the second transistors over the delay period of time before the start of the data integration of the DFE tap circuitry.

2. The apparatus of claim 1, wherein the one or more delay elements include:

one or more first delay elements to provide a delayed data integration clock signal of the one or more delayed data integration clock signals responsive to a data integration clock signal of the one or more data integration clock signals; and one or more second delay elements to provide the complementary delayed data integration clock signal responsive to a complementary data integration clock signal.

3. The apparatus of claim 2, the delayed data integration clock signal to control switching of the third electrically controllable switch and the fourth electrically controllable switch to electrically connect the common mode voltage potential node to the gate terminals of the first transistors and the gate terminals of the second transistors over the delay period of time during a reset state of the DFE tap circuitry.

4. The apparatus of claim 3, wherein the history bit and the complementary history bit switch logic states during the reset state of the DFE tap circuitry.

5. The apparatus of claim 2, wherein the data integration clock signal is substantially ninety degrees out of phase with a data sampling clock signal.

6. The apparatus of claim 1, wherein the one or more delay elements include strings of logic gates to delay the one or more data integration clock signals.

7. The apparatus of claim 1, comprising the DFE tap circuitry, the DFE tap circuitry including:

a first common mode current source;

a second common mode current source;

a first pull-down current source;

a second pull-down current source;

a first pair of transistors including one of the first transistors electrically connected from the first common mode current source to the first pull-down current source and one of the second transistors electrically connected from the second common mode current source to the first pull-down current source; and a second pair of transistors including another one of the first transistors electrically connected from the second common mode current source to the second pull-down current source and another one of the second transistors electrically connected from the first common mode current source to the second pull-down current source.

8. The apparatus of claim 7, comprising:

a first output node electrically connected between the first common mode current source and the one of the first transistors; and a second output node electrically connected between the second common mode current source and the other one of the first transistors.

\* \* \* \* \*